United States Patent
Sun

(10) Patent No.: US 6,902,941 B2
(45) Date of Patent: Jun. 7, 2005

(54) PROBING OF DEVICE ELEMENTS

(75) Inventor: Luen-Chian Sun, Kaohsiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 101 days.

(21) Appl. No.: 10/386,088

(22) Filed: Mar. 11, 2003

(65) Prior Publication Data

US 2004/0180456 A1 Sep. 16, 2004

(51) Int. Cl.[7] .............................................. H01L 21/66
(52) U.S. Cl. ........................................ 438/17; 438/14
(58) Field of Search ..................................... 438/14, 17

(56) References Cited

U.S. PATENT DOCUMENTS

| | | | |
|---|---|---|---|
| 5,530,372 A | * | 6/1996 | Lee et al. .................... 324/758 |
| 6,403,388 B1 | * | 6/2002 | Birdsley et al. .............. 438/17 |
| 6,518,783 B1 | * | 2/2003 | Birdsley et al. ............. 324/763 |
| 6,548,314 B1 | * | 4/2003 | Zaidi .......................... 438/14 |
| 6,720,641 B1 | * | 4/2004 | Birdsley et al. ............. 257/621 |
| 2004/0112857 A1 | * | 6/2004 | Herschbein et al. .......... 216/21 |

OTHER PUBLICATIONS

Matusiewicz et al., THe role of focused ion beams in physical failure analysis, *Proc. Inter. Reliability Physics Symp.*, (Apr. 1991) 167.*

* cited by examiner

*Primary Examiner*—Christian Wilson
(74) *Attorney, Agent, or Firm*—Tung & Associates

(57) ABSTRACT

A new and improved method for the probing of integrated circuits (ICs) and is particularly suitable for probing various elements of an IC for failure analysis or other electrical testing and/or measurement of the IC. The method includes providing a probe access trench in the IMD (intermetal dielectric) or other substrate adjacent to the circuit element to be tested and then providing direct electrical contact between the test probe and the sidewall of the element through the trench, during the testing process. Such direct electrical contact between the test probe and the sidewall of the element prevents excessively high contact resistance which may otherwise occur in the use of a probing pad between the test probe and the element.

20 Claims, 2 Drawing Sheets

PROBING OF DEVICE ELEMENTS

FIELD OF THE INVENTION

The present invention relates to IC metrology and defect inspection techniques used in the inspection of defects in WIP (work-in-progress) wafers during the fabrication of semiconductor integrated circuits. More particularly, the present invention relates to probing of elements such as metal lines or vias in a microelectronic device by forming a probe access trench adjacent to the element and accessing the element with a test probe through the trench to prevent the need for forming a probing pad on the element and contacting the element through the probing pad.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Circuit elements include metal lines which connect various components with each other in a horizontal plane, as well as contact vias, which extend through insulative layers and provide electrical conduction between vertically-spaced conductive layers or circuit components. The final yield of functional circuits on the wafer depends on proper application of each layer during the process steps. Proper application of those layers depends, in turn, on coating the material in a uniform spread over the surface of the wafer in an economical and efficient manner.

Throughout the IC fabrication process, the WIP wafers must be frequently tested to monitor the physical and electrical properties of the devices being fabricated thereon. Wafer testing is carried out on sample wafers using a measurement tool and equipment to analyze the data. These testing tools and equipment may use physical methods that allow ions, electrons and/or electromagnetic radiation to interact with the device features, and then examine the secondary particles and/or radiations that are produced. The information obtained from the interaction of the particles and/or radiation with a region of interest in the device is then used to deduce the properties of the materials in the region of interest. The information may reveal the presence of defects, which are characteristics of the wafer or results of the wafer fabrication process that cause nonconformance to the specified wafer requirements.

In the manufacture of semiconductor devices, failure analysis and characterization of circuits frequently requires that waveform measurements be obtained from circuit elements. During the integrated circuit development phase, the device is subjected to various test conditions such as speed, temperature, etc. Performance parameters of the device are obtained by acquiring waveforms from key circuit nodes such as clock lines, enable signals, address buses and data buses, in the device. If the performance parameters indicate the presence of defects in the device, it is necessary to trace back the source of the defects in order to take corrective measures.

Waveform data can be acquired from circuit elements by direct-contact mechanical probing or electron beam probing. This is accomplished by establishing electrical contact between a testing apparatus and one or more of the numerous input/output (I/O) circuit elements in the device. In some instances, these I/O circuit elements are placed in the periphery of the device or located in such a manner as to provide some degree of access to the active surface of the device by some form of mechanical or electron beam probe during operation.

Conventional methods of probing circuit elements for failure analysis of a device include initially sputtering a probing pad on a metal line or other element in the circuit in order to enlarge the contact area for the metal test probe of a testing apparatus. The test probe of the testing apparatus is then placed into contact with the probing pad to test various electrical characteristics of the circuit through the pad. However, one of the limitations of using the probing pad is that the probing pad introduces a relatively high contact resistance into the electrical conduction between the metal line or other element and the test probe. This may result in attenuated electrical signals that are picked up by the test probe and translate into faulty test data obtained from the device. Furthermore, because metal lines of a device typically run in closely-spaced, adjacent relationship to each other, the contact pads often establish electrical contact between two or more adjacent metal lines in the circuit. This causes electrical bridging and leakage which, in turn, results in faulty test data. In the case of circuit elements which are relatively isolated electrically from adjacent elements in the device, the test probe may be placed directly into contact with the metal line or other element in order to reduce the high contact resistance imparted by the probing pad as well as electrical bridging or junction leakage between circuit elements that may be otherwise caused by using a probing pad. However, such direct contact between the test probe and the circuit element can be used only under limited circumstances, since direct probing of metal lines or other elements in a dense circuit layout would cause simultaneous electrical contact of the test probe with one or more adjacent metal lines or elements in addition to the line or element being tested. Accordingly, a new and improved method is needed for probing elements of an integrated circuit device and which method avoids the contact resistance and other drawbacks of providing electrical contact between a test probe and an element in the circuit through a probing pad.

An object of the present invention is to provide a new and improved method of probing elements of an integrated circuit (IC) device for the purpose of electrical testing or measurement.

Another object of the present invention is to provide a new and improved IC device circuit probing method which can be used to probe a variety of IC circuit elements.

Still another object of the present invention is to provide a new and improved method of probing various circuit elements in an IC device, which method includes providing a probe access trench adjacent to a circuit element and providing electrical contact between a test probe and the element through the trench.

Yet another object of the present invention is to provide a new and improved probing method for the electrical testing and/or measurement of an IC device, which probing method includes providing a probe access trench in a substrate adjacent to the circuit element to be tested; providing a liner pad over the trench; and providing electrical contact between a test probe and the circuit element through the trench.

A still further object of the present invention is to provide a new and improved probing method which may be used for the electrical testing and/or measurement of metal lines, contact vias or p/n junctions in an IC device.

SUMMARY OF THE INVENTION

In accordance with these and other objects and advantages, the present invention is generally directed to a new and improved method for the probing of integrated circuits (ICs) and is particularly suitable for probing various elements of an IC for failure analysis or other electrical testing and/or measurement of the IC. The method includes providing a probe access trench in the IMD (intermetal dielectric) or other substrate adjacent to the circuit element to be tested and then providing direct electrical contact between the test probe and the sidewall of the element through the trench, during the testing process. Such direct electrical contact between the test probe and the sidewall of the element prevents excessively high contact resistance which may otherwise occur in the use of a probing pad between the test probe and the element.

The present invention is suitable for the probing of a variety of IC elements such as metal lines, contact vias and p/n junctions, for example. After cutting the probe access trench in the substrate and prior to providing direct contact between the test probe and the circuit element, an electrically insulative liner pad may be deposited over the trench to electrically insulate the test probe from adjacent circuit elements and prevent particle contamination of the elements caused by the presence of the test probe, as well as bridging and junction leakage. The liner pad is typically an oxide but may be any suitable alternative electrically-insulative material.

The probe access trench may be cut in the wafer substrate or other material surrounding the element using FIB (Focused Ion Beam) technology or any suitable alternative technique. In a typical embodiment, the trench has a width of less than about 1 m, a length of about 1 m and a depth of up to about 3,000.

BRIEF DESCRIPTION OF THE DRAWINGS

The invention will now be described, by way of example, with reference to the accompanying drawings, in which.

DESCRIPTION OF THE PREFERRED EMBODIMENTS

The methods of the present invention are suitable for probing an IC device preparatory to carrying out a variety of electrical tests and/or measurements, including failure analysis, for example, on the device without the need for interposing a probing pad between a test probe and the various elements of the integrated circuit to be contacted with the probe. The IC elements which may be contacted by the probe for the various electrical tests may include metal lines, contact vias or p/n junctions, in non-exclusive particular. Direct electrical contact between the test probe and the element avoids the excessively high contact resistance which is characteristic of the conventional test probing method in which the probing pad is interposed between the probe tip and the element during testing.

Figure 1A:
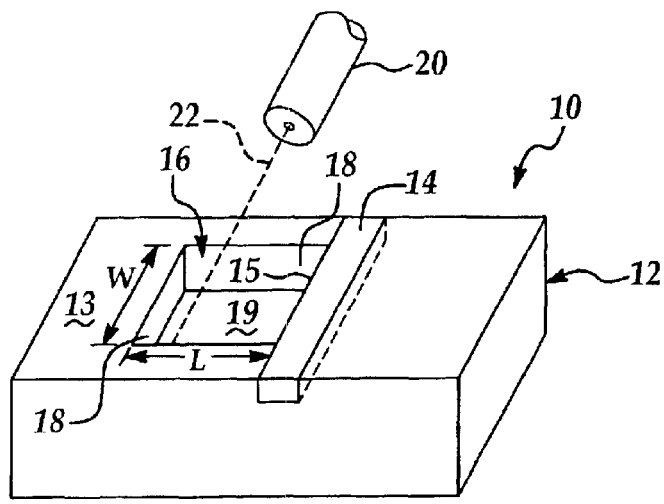
FIG. 1A is a perspective view of a portion of an IC device, illustrating cutting of a probe access trench in an intermetal dielectric (IMD) to expose a sidewall of a metal line in the device as a first step preparatory to probing of the metal line in accordance with the present invention.
Figure 1B:
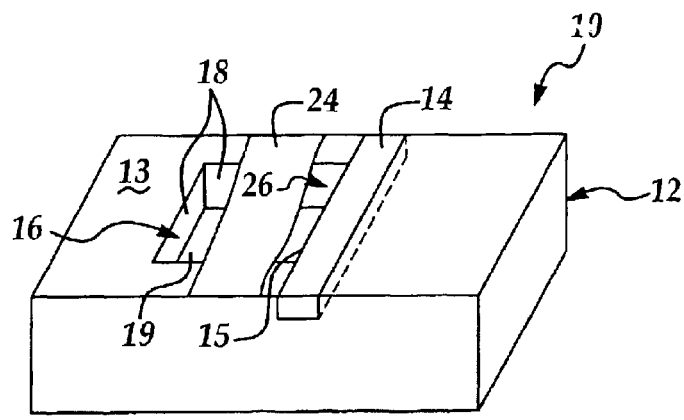
FIG. 1B is a perspective view of the IC device portion of FIG. 1A, illustrating a liner pad placed over the probe access trench as a second step preparatory to probing of the metal line in accordance with the present invention.
Figure 1C:
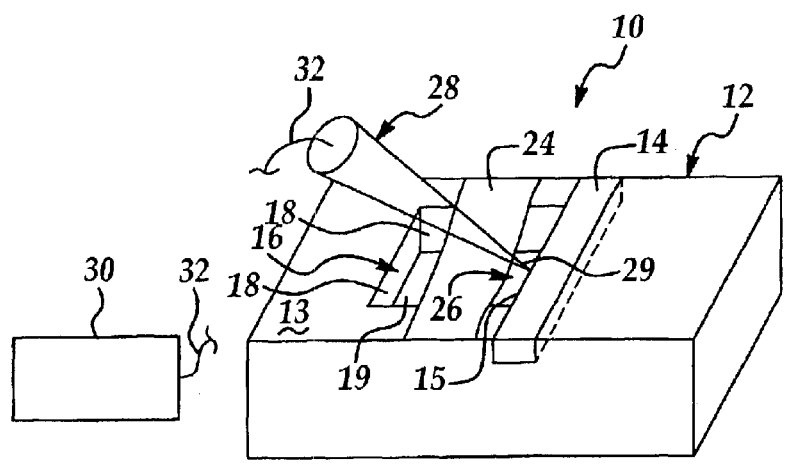
FIG. 1C is a perspective view of the IC device portion of FIGS. 1A and 1B, illustrating a test probe placed into direct electrical contact with the exposed sidewall of the metal line through the trench as a third step in the circuit probing method in accordance with the present invention.

Referring initially to FIGS. 1A–1C, a section of an IC device 10 taken from a wafer (not shown) includes a metal line 14 that connects circuit elements such as transistors, resistors and diodes (not shown) in the IC device 10. Testing and/or measurement of various electrical characteristics of the IC device 10, including failure analysis in the event of failure of the IC device 10, may be carried out by contacting a test probe 28 to the metal line 14, as shown in FIG. 1C and hereinafter further described. As a first step in the circuit probing method according to the present invention, shown in FIG. 1A, a typically rectangular probe access trench 16 is cut in the upper surface 13 of an IMD (intermetal dielectric) layer 12 on one side of the metal line 14, to expose the sidewall 15 of the metal line 14. This cutting process is carried out typically using a focused ion beam (FIB) 22 emitted from an FIB emitter 20, according to the knowledge of those skilled in the art, although alternative techniques known by those skilled in the art may be used for the purpose. The probe access trench 16 has trench walls 18 and a trench bottom 19, and may have a width "W" of less than about 1 m, a length "L" of typically about 5000 or 1 m, and a depth of up to about 3,000.

As shown in FIG. 1B, as a second step of the circuit probing method according to the present invention, a liner pad 24 is deposited on the IMD 12 and spans the probe access trench 16, to electrically isolate the metal line 14 from adjacent metal lines (not shown) and other circuit elements (not shown) in the IC device 10. The liner pad 24 may be an elongated oxide strip that is formed on the IMD 12 according to methods which are known by those skilled in the art. However, it is understood that the liner pad 24 may be suitable alternative electrically insulative materials known by those skilled in the art. A probe gap 26, the purpose of which will be hereinafter described, is defined between the liner pad 24 and the sidewall 15 of the metal line 14.

As shown in FIG. 1C, as a final step in accordance with the circuit probing method, a test probe 28 having a pointed microprobe tip 29 is inserted through the probe gap 26 between the liner pad 24 and the metal line sidewall 15, and placed into direct physical contact with the sidewall 15. The test probe 28 is connected by wiring 32 to a conventional testing unit 30, the particular type of which depends upon the electrical characteristics of the IC device 10 to be measured. For example, the test probe 28 and testing unit 30 may be used to conduct failure analysis to determine the faulty element or elements in the IC device 10. It will be appreciated by those skilled in the art that the direct physical contact between the microprobe tip 29 and the sidewall 15 prevents the electrical signals flowing from the metal line 14 to the test probe 28 during testing from being attenuated by the relatively high contact resistance that is a characteristic of conventional probing methods in which a probing pad (not shown) is interposed between the microprobe tip 29 and the upper surface of the metal line 14.

Figure 2A:
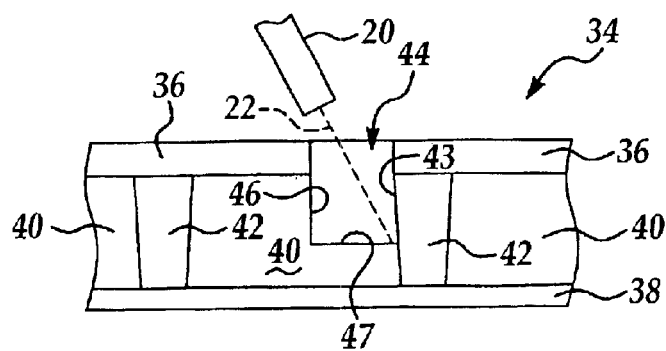
FIG. 2A is a schematic view of a portion of an IC device, illustrating cutting of a probe access trench in an IMD to expose a sidewall of a contact via as a first step preparatory to probing of the via in accordance with another embodiment of the present invention.
Figure 2B:
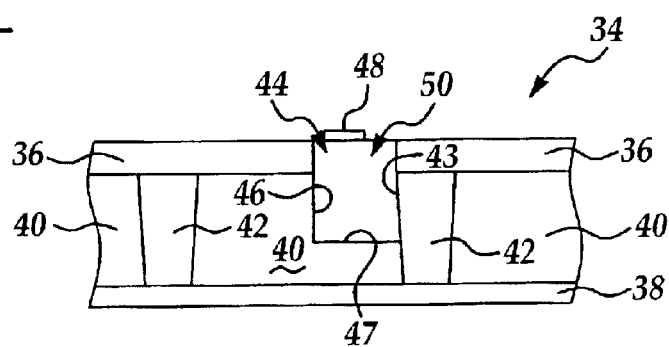
FIG. 2B is a schematic view of the IC device portion of FIG. 2A, illustrating a liner pad placed over the probe access trench as a second step preparatory to probing of the via in accordance with the present invention.
Figure 2C:
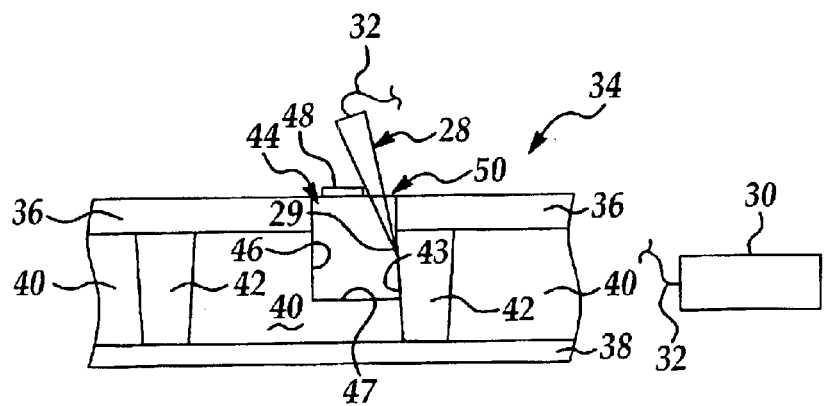
FIG. 2C is a perspective view of the IC device portion of FIGS. 2A and 2B, illustrating a test probe placed into direct electrical contact with the sidewall of the via as a third step in probing of the via in accordance with the present invention.

Referring next to FIGS. 2A–2C, in another embodiment the test probing method of the present invention is suitable for probing of an IC device 34 which includes contact vias 42 that connect a top conducting layer 36 to a bottom conducting layer 38 through an IMD 40 in the IC device 34. As a first step in the probing method, shown in FIG. 2A, a probe access trench 44 is cut through the top conducting layer 36 and part of the underlying IMD 40 on one side of the contact via 42, to expose the sidewall 43 of the contact via 42. This is carried out typically using a focused ion beam (FIB) 22 emitted from an FIB emitter 20, according to the knowledge of those skilled in the art, although alternative techniques known by those skilled in the art may be used for the purpose. The probe access trench 44 has trench walls 46 and a trench bottom 47, and may have a width of less than about 1 m, a length of typically about 5000 or 1 m, and a depth of up to about 3,000, as heretofore described with respect to FIG. 1A.

As shown in FIG. 2B, as a second step in the probing method, a liner pad 48, which may be an oxide strip, is deposited on the IC device 34 and spans the probe access trench 44, to electrically isolate the contact via 42 from adjacent circuit elements such as an adjacent contact via 42 in the IC device 34. A probe gap 50 is defined between the liner pad 48 and the sidewall 43 of the contact via 42.

As shown in FIG. 2C, as a final step in the probing method, a test probe 28 is inserted through the probe gap 50 between the liner pad 48 and the contact sidewall 43, with the microprobe tip 29 disposed in direct physical contact with the sidewall 43. While the microprobe tip 29 remains in contact with the sidewall 43, the test probe 28 and testing unit 30 are used to conduct failure analysis or other electrical tests and/or measurements on the IC device 34, as is known by those skilled in the art.

Figure 3:
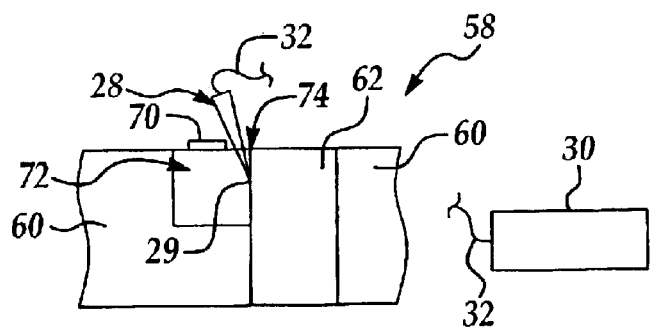
FIG. 3 is a schematic view of a portion of an IC device, with a probe access trench cut in a substrate containing a p/n junction to expose the p/n junction in the substrate and illustrating a test probe in direct electrical contact with the p/n junction for electrical testing and/or measurement of the p/n junction in still another embodiment of the present invention.

Referring next to FIG. 3, in still another embodiment of the probing method of the present invention electrical tests and/or measurements are carried out on an IC device 58 by providing direct electrical contact between the microprobe tip 29 of a test probe 28 and a p/n junction 62 in a wafer substrate 60, through a probe access trench 72. Accordingly, the probe access trench 72 is initially cut in the wafer substrate 60, adjacent to the p/n junction 62, typically although not necessarily using a focused ion beam 22 emitted from a focused ion beam emitter 20, as heretofore described with respect to FIG. 2A. A typically oxide liner pad 70 is then deposited on the wafer substrate 60 and spans across the probe access trench 72. Finally, the test probe 28 is inserted through the probe gap 74 defined between the liner pad 70 and the p/n junction 62 to provide direct electrical contact between the microprobe tip 29 and the p/n junction 62. The various electrical tests and/or measurements are then carried out by operation of the testing unit 30, according to the knowledge of those skilled in the art.

While the preferred embodiments of the invention have been described above, it will be recognized and understood that various modifications can be made in the invention and the appended claims are intended to cover all such modifications which may fall within the spirit and scope of the invention.

What is claimed is:

1. A method of probing an element in an integrated circuit, comprising the steps of:
   exposing a sidewall of the element by providing a probe access trench in the integrated circuit adjacent to the element;
   providing an electrically insulative liner pad horizontally over said probe access trench in spaced-apart relationship to the element; and
   inserting a test probe into said probe access trench, between said liner pad and the sidewall and into contact with the sidewall of the element.

2. The method of claim 1 wherein the element comprises a metal line.

3. The method of claim 1 wherein said test probe comprises a microprobe tip.

4. The method of claim 3 wherein the element comprises a metal line.

5. The method of claim 1 wherein said probe access trench has a width of less than about 1 µm, a length of about 1 µm and a depth of about 3,000 angstroms.

6. The method of claim 5 wherein the element comprises a metal line.

7. The method of claim 5 wherein said test probe comprises a microprobe tip.

8. The method of claim 7 wherein the element comprises a metal line.

9. The method of claim 1 wherein said providing a probe access trench in the integrated circuit comprises the step of cutting a probe access trench in the integrated circuit using a focused ion beam.

10. The method of claim 9 wherein the element comprises a metal line.

11. The method of claim 9 wherein said test probe comprises a microprobe tip.

12. The method of claim 9 wherein said probe access trench has a width of less than about 1 µm, a length of about 1 µm and a depth of about 3,000 angstroms.

13. A method of probing a contact via in an integrated circuit, comprising the steps of:

exposing a sidewall of the contact via by providing a probe access trench in the integrated circuit adjacent to the contact via;

providing an electrically insulative liner pad over said probe access trench in spaced-apart relationship to the contact via; and inserting a test probe into said probe access trench, between said liner pad and the sidewall and into contact with the sidewall of the contact via.

14. The method of claim 13 wherein said test probe comprises a microprobe tip.

15. The method of claim 13 wherein said probe access trench has a width of less than about 1 μm, a length of about 1 μm and a depth of about 3,000 angstroms.

16. The method of claim 13 wherein said providing a probe access trench in the integrated circuit comprises the step of cutting a probe access trench in the integrated circuit using a focused ion beam.

17. A method of probing a p/n junction in an integrated circuit, comprising the steps of:

exposing the p/n junction by providing a probe access trench in the integrated circuit adjacent to the p/n junction;

providing an electrically insulative liner pad horizontally over said probe access trench in spaced-apart relationship to the p/n junction; and inserting a test probe into said probe access trench, between said liner pad and the p/n junction and into contact with the p/n junction.

18. The method of claim 17 wherein said test probe comprises a microprobe tip.

19. The method of claim 17 wherein said probe access trench has a width of less than about 1 μm, a length of about 1 μm and a depth of about 3,000 angstroms.

20. The method of claim 17 wherein said providing a probe access trench in the integrated circuit comprises the step of cutting a probe access trench in the integrated circuit using a focused ion beam.

* * * * *